US012581842B2

(12) United States Patent
Du et al.

(10) Patent No.: US 12,581,842 B2
(45) Date of Patent: Mar. 17, 2026

(54) DISPLAY PANEL, DISPLAY DEVICE AND MANUFACTURING METHOD FOR DISPLAY PANEL

(71) Applicant: BOE Technology Group Co., Ltd., Beijing (CN)

(72) Inventors: Shuang Du, Beijing (CN); Paoming Tsai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 386 days.

(21) Appl. No.: 18/267,580

(22) PCT Filed: Oct. 22, 2021

(86) PCT No.: PCT/CN2021/125646
§ 371 (c)(1),
(2) Date: Jun. 15, 2023

(87) PCT Pub. No.: WO2022/183744
PCT Pub. Date: Sep. 9, 2022

(65) Prior Publication Data
US 2024/0057458 A1 Feb. 15, 2024

(30) Foreign Application Priority Data

Mar. 4, 2021 (CN) .......................... 202110237723.3

(51) Int. Cl.
*H10K 59/80* (2023.01)
*H10K 59/12* (2023.01)
*H10K 59/122* (2023.01)

(52) U.S. Cl.
CPC ..... *H10K 59/8792* (2023.02); *H10K 59/1201* (2023.02); *H10K 59/122* (2023.02)

(58) Field of Classification Search
CPC ........... H10K 59/8792; H10K 59/1201; H10K 59/122
See application file for complete search history.

(56) References Cited

U.S. PATENT DOCUMENTS

2008/0218064 A1 9/2008 Cho et al.
2012/0097990 A1* 4/2012 Koh ................... H10K 59/8791
257/40
(Continued)

FOREIGN PATENT DOCUMENTS

CN 101257747 A 9/2008
CN 109817676 A * 5/2019
(Continued)

OTHER PUBLICATIONS

CN202110237723.3 first office action.
CN202110237723.3 second office action.
PCT/CN2021/125646 international search report.

*Primary Examiner* — Mariceli Santiago
(74) *Attorney, Agent, or Firm* — IPro, PLLC

(57) ABSTRACT

A display panel, a display apparatus, and a manufacturing method for the display panel. The display panel includes a base substrate; a first electrode layer; a light-emitting layer, the light-emitting layer including a plurality of light-emitting portions emitting light of different colors; a second electrode layer located at the side of the light-emitting layer facing away from the first electrode layer; a black matrix layer located at the side of the second electrode layer facing away from the light-emitting layer, the black matrix layer comprising a plurality of light exiting ports in one-to-one correspondence with the plurality of light-emitting portions; and a shielding layer located at the side of the black matrix layer facing away from the second electrode layer and having a plurality of shielding portions covering the light (Continued)

exiting ports, and the transmittance of the shielding portions is higher than the transmittance of the black matrix layer.

15 Claims, 4 Drawing Sheets

(56)                      References Cited

U.S. PATENT DOCUMENTS

| | | | |
|---|---|---|---|
| 2015/0048316 A1* | 2/2015 | Choi | H10K 59/8792 |
| | | | 257/40 |
| 2015/0243930 A1* | 8/2015 | Kim | H10K 59/8791 |
| | | | 257/40 |
| 2016/0172426 A1 | 6/2016 | Kim et al. | |
| 2018/0053918 A1 | 2/2018 | Woo et al. | |
| 2021/0118962 A1* | 4/2021 | Shin | H10K 59/8792 |
| 2021/0193741 A1* | 6/2021 | Chen | H10K 59/8792 |
| 2023/0180587 A1 | 6/2023 | Liu et al. | |

FOREIGN PATENT DOCUMENTS

| | | |
|---|---|---|
| CN | 110071149 A | 7/2019 |
| CN | 111900263 A | 11/2020 |
| CN | 113036056 A | 6/2021 |

* cited by examiner

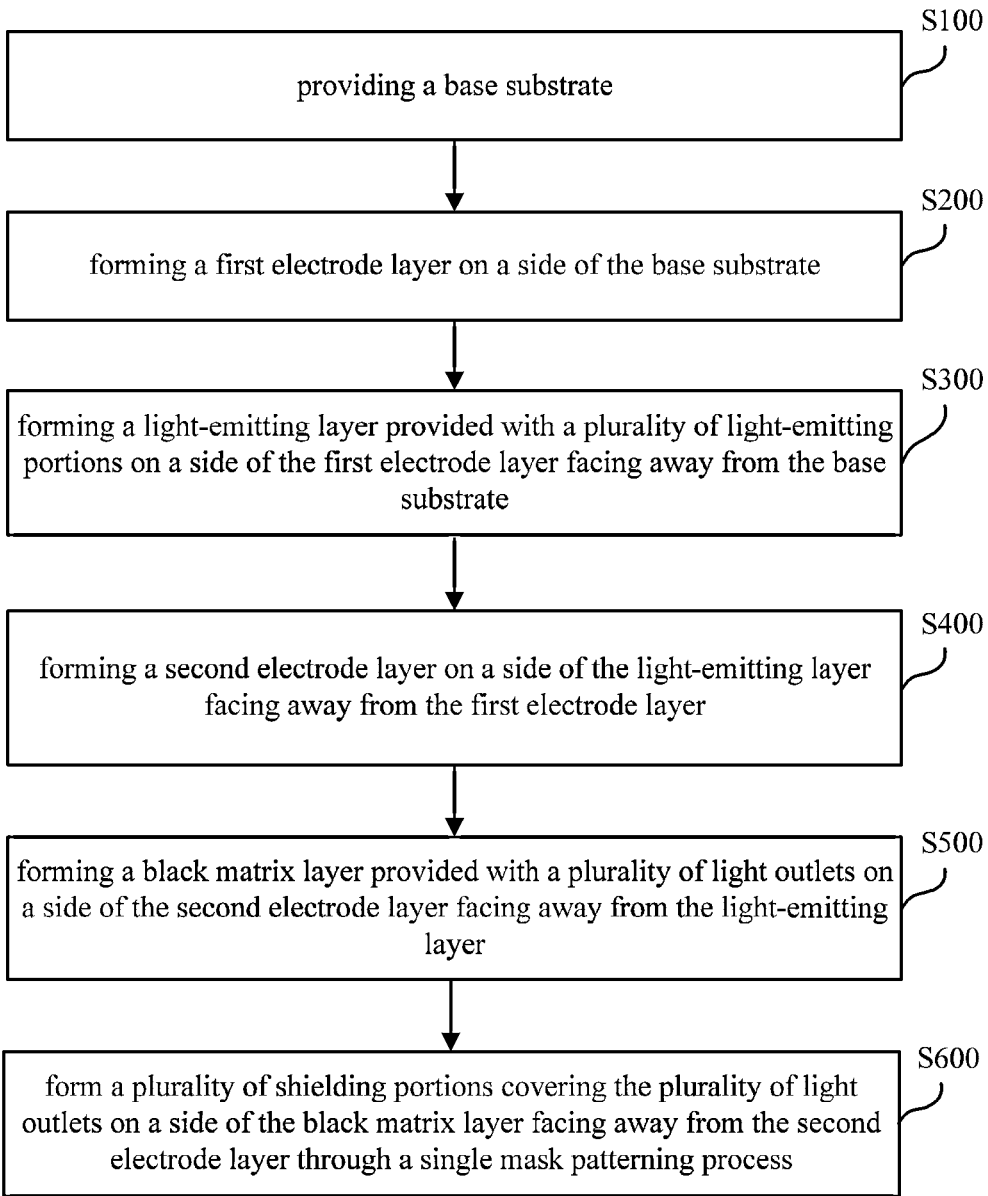

S100 providing a base substrate

S200 forming a first electrode layer on a side of the base substrate

S300 forming a light-emitting layer provided with a plurality of light-emitting portions on a side of the first electrode layer facing away from the base substrate

S400 forming a second electrode layer on a side of the light-emitting layer facing away from the first electrode layer

S500 forming a black matrix layer provided with a plurality of light outlets on a side of the second electrode layer facing away from the light-emitting layer

S600 form a plurality of shielding portions covering the plurality of light outlets on a side of the black matrix layer facing away from the second electrode layer through a single mask patterning process

Fig. 4

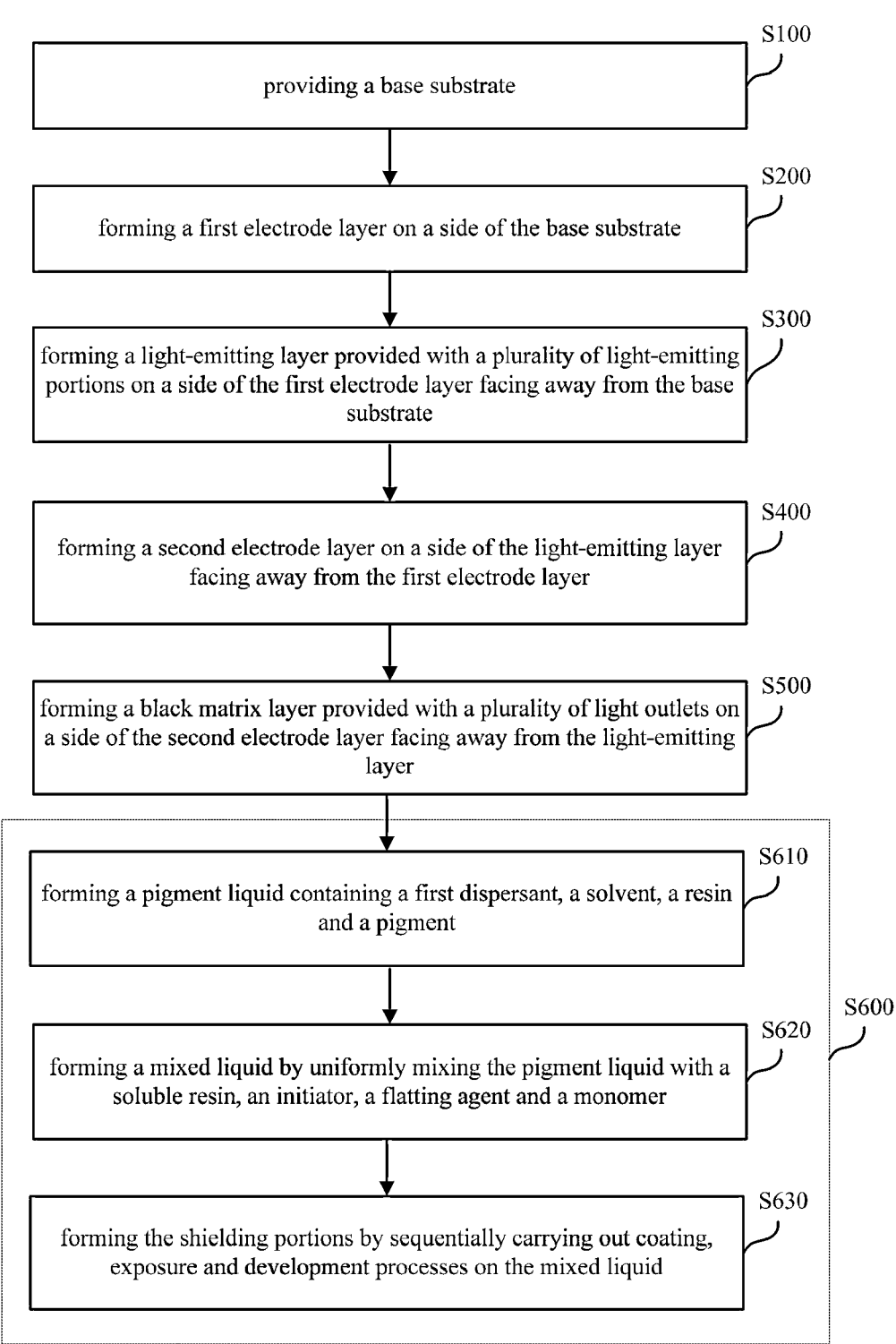

S100 providing a base substrate

S200 forming a first electrode layer on a side of the base substrate

S300 forming a light-emitting layer provided with a plurality of light-emitting portions on a side of the first electrode layer facing away from the base substrate

S400 forming a second electrode layer on a side of the light-emitting layer facing away from the first electrode layer

S500 forming a black matrix layer provided with a plurality of light outlets on a side of the second electrode layer facing away from the light-emitting layer

S610 forming a pigment liquid containing a first dispersant, a solvent, a resin and a pigment

S620

S600 forming a mixed liquid by uniformly mixing the pigment liquid with a soluble resin, an initiator, a flatting agent and a monomer

S630 forming the shielding portions by sequentially carrying out coating, exposure and development processes on the mixed liquid

Fig. 5

DISPLAY PANEL, DISPLAY DEVICE AND MANUFACTURING METHOD FOR DISPLAY PANEL

CROSS REFERENCE TO RELATED APPLICATION

This application is a national phase entry under 35 U.S.C § 371 of International Application No. PCT/CN2021/125646, filed Oct. 22, 2021, which claims the benefit of priority to Chinese patent application No. 202110237723.3, filed with the China National Intellectual Property Administration on Mar. 4, 2021 and entitled "DISPLAY PANEL, DISPLAY APPARATUS AND MANUFACTURING METHOD", which is incorporated herein in its entirety by reference.

TECHNICAL FIELD

The present disclosure relates to the field of semiconductors, and particularly to a display panel, a display device and a manufacturing method.

BACKGROUND

Current displays mainly include a liquid crystal display (LCD), an organic light-emitting diode (OLED) display, a plasma display panel (PDP), an electronic ink display, etc. With numerous merits of lightness, thinness, active light emission, fast response speed, wide viewing angle, abundant colors, high brightness, low power consumption, high and low temperature resistance, and so on, the OLED display have been hailed by the industry as the third-generation display technology after the LCD display, and can be widely used in terminal products such as smart phones, tablet computers, televisions, etc.

In the case of the OLED display panel in the prior art, a planarization layer in a back plate cannot be completely smooth due to the need for a via hole, so an anode cannot be completely smooth either. In a screen-off state, when ambient light reaches the display panel, pixels of different colors reflect light in different directions, such that light of different colors is reflected in different directions, resulting in color separation, as shown in FIG. 1.

SUMMARY

Embodiments of the present disclosure provide a display panel. The display panel includes:

a base substrate;

a first electrode layer, located on a side of the base substrate;

a light-emitting layer, located on a side of the first electrode layer facing away from the base substrate, and the light-emitting layer includes a plurality of light-emitting portions emitting light of different colors;

a second electrode layer, located on a side of the light-emitting layer facing away from the first electrode layer;

a black matrix layer, located on a side of the second electrode layer facing away from the light-emitting layer, and the black matrix layer includes a plurality of light outlets corresponding to the plurality of light-emitting portions in a one-to-one correspondence; and a shielding layer, located on a side of the black matrix layer facing away from the second electrode layer, and is provided with a plurality of shielding portions covering the light outlets; transmittance of the shielding portion is greater than transmittance of the black matrix layer, and light passing through the plurality of light outlets is partially blocked and partially transmitted by the shielding portion.

In a possible implementation mode, the transmittance of the shielding portion is 60 times to 80 times the transmittance of the black matrix layer.

In a possible implementation mode, the transmittance of the shielding portion is 40% to 60%.

In a possible implementation mode, the shielding layer and the black matrix layer contain the same composition in different proportions.

In a possible implementation mode, the shielding layer and the black matrix layer both contain particulate light-blocking pigments, and a mass ratio of the particulate light-blocking pigment in the shielding layer is half a mass ratio of the particulate light-blocking pigment in the black matrix layer.

In a possible implementation mode, a material of the particulate light-blocking pigment includes one or a combination of:

carbon;

titanium; and nickel.

In a possible implementation mode, the shielding layer and the black matrix layer both contain flaky light-blocking pigments, and a mass ratio of the flaky light-blocking pigment in the shielding layer is half a mass ratio of the flaky light-blocking pigment in the black matrix layer.

In a possible implementation mode, a material of the pigment includes one or a combination of:

titanium dioxide;

titanium; and nickel.

In a possible implementation mode, materials forming the shielding layer the shielding layer and the black matrix layer both includes a first dispersant, a solvent and a resin;

a mass ratio of the first dispersant in the shielding layer is the same as a mass ratio of the first dispersant in the black matrix layer;

a mass ratio of the solvent in the shielding layer is greater than a mass ratio of the solvent in the black matrix layer; and a mass ratio of the resin in the shielding layer is greater than a mass ratio of the resin in the black matrix layer.

In a possible implementation mode, an orthographic projection of the shielding portion on the base substrate overlaps an orthographic projection of the light-emitting portion on the base substrate.

In a possible implementation mode, a pixel defining layer is further arranged between the light-emitting layer and the first electrode layer, the pixel defining layer is provided with a plurality of pixel openings, and the plurality of light-emitting portions are located in the plurality of pixel openings; and the pixel defining layer is made of the same material as the black matrix layer.

The embodiments of the present disclosure further provide a display apparatus. The display apparatus includes the display panel provided in the embodiments of the present disclosure.

The embodiments of the present disclosure further provide a manufacturing method for manufacturing the display panel provided in the embodiments of the present disclosure. The manufacturing method includes:

providing a base substrate;

forming a first electrode layer on a side of the base substrate;

forming a light-emitting layer provided with a plurality of light-emitting portions on a side of the first electrode layer facing away from the base substrate;

forming a second electrode layer on a side of the light-emitting layer facing away from the first electrode layer;

forming a black matrix layer provided with a plurality of light outlets on a side of the second electrode layer facing away from the light-emitting layer; and forming a plurality of shielding portions covering the plurality of light outlets on a side of the black matrix layer facing away from the second electrode layer through a single mask patterning process.

In a possible implementation mode, the forming a plurality of shielding portions covering the plurality of light outlets on a side of the black matrix layer facing away from the second electrode layer through a single mask patterning process includes:

forming a pigment liquid containing a first dispersant, a solvent, a resin and a pigment;

forming a mixed liquid by uniformly mixing the pigment liquid with a soluble resin, an initiator, a flatting agent and a monomer; and forming the shielding portions by sequentially carrying out coating, exposure and development processes on the mixed liquid.

In a possible implementation mode, the forming a pigment liquid containing a first dispersant, a solvent, a resin and a pigment includes:

forming the pigment liquid by mixing 7.5 to 17.5 phr of pigments, 2 to 7 phr of resins, 1 to 3 phr of first dispersants, and 70 to 85 phr of solvents.

BRIEF DESCRIPTION OF FIGURES

FIG. 4 is a schematic diagram of a manufacturing process for a display panel according to an embodiment of the present disclosure.

FIG. 5 is a schematic diagram of another manufacturing process for a display panel according to an embodiment of the present disclosure.

DETAILED DESCRIPTION

In order to make objectives, technical solutions and advantages of embodiments of the present disclosure clearer, the technical solutions of the embodiments of the present disclosure will be clearly and completely described below in combination with accompanying drawings in the embodiments of the present disclosure. Apparently, the described embodiments are merely some embodiments rather than all embodiments of the present disclosure. On the basis of the described embodiments of the present disclosure, all other embodiments obtained by those of ordinary skill in the art without making creative efforts all fall within the scope of protection of the present disclosure.

Unless otherwise defined, technical terms or scientific terms used in the present disclosure should have the ordinary meanings understood by those of ordinary skill in the art to which the present disclosure belongs. "First", "second" and other similar words used in the present disclosure do not indicate any order, quantity or importance, but are merely used to distinguish between different components. "Include", "comprise" or other similar words mean that an element or object appearing before the word contains elements or objects listed after the word and its equivalents, without excluding other elements or objects. "Connected", "connected to each other" or other similar words are not limited to physical or mechanical connections, but can include electrical connections, whether direct or indirect. Terms "up", "down", "left", "right", etc. are merely used to indicate relative position relations, and when the absolute position of a described object changes, the relative position may change accordingly.

In order to keep the following descriptions of embodiments of the present disclosure clear and concise, the present disclosure omits detailed descriptions of known functions and known components.

Figure 1:
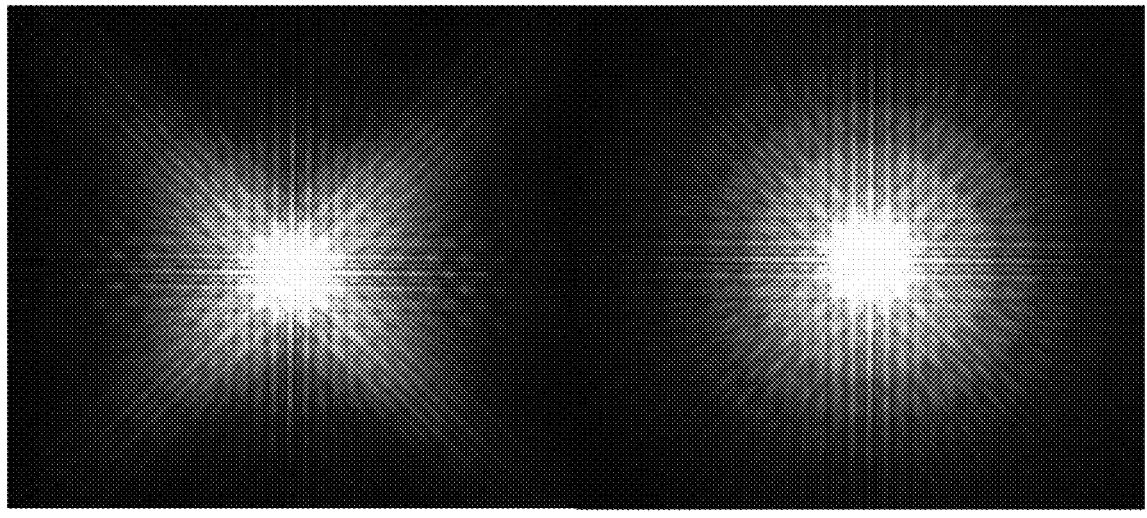
FIG. 1 is a schematic morphological diagram of color separation.
Figure 2:
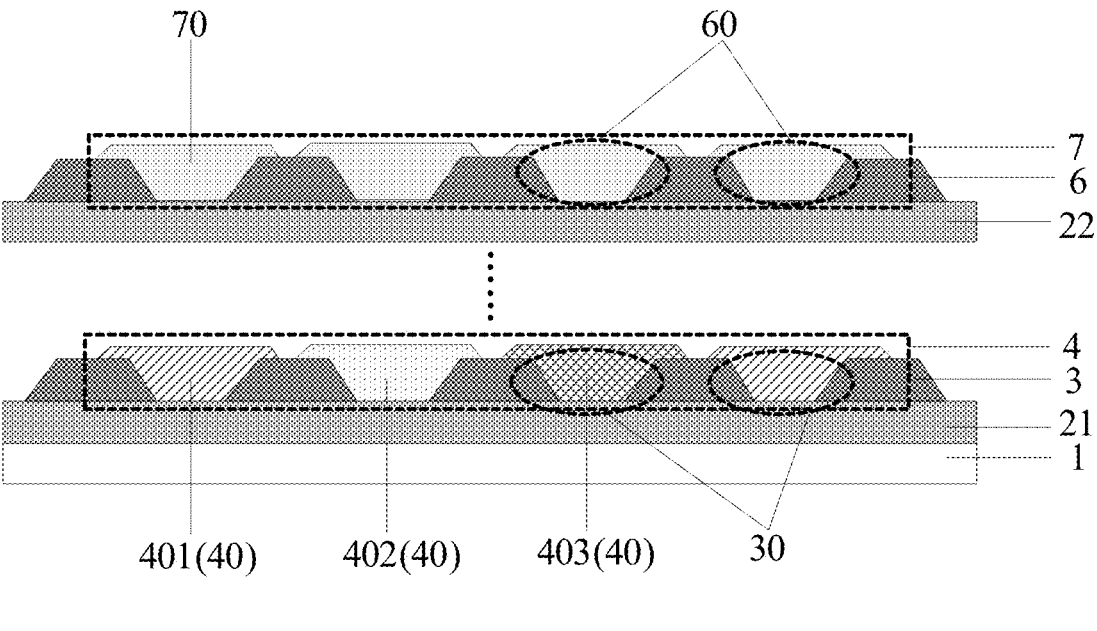
FIG. 2 is a schematic structural diagram of a display panel according to an embodiment of the present disclosure.

With reference to FIG. 2, the embodiments of the present disclosure provide a display panel. The display panel includes:

a base substrate 1, where the base substrate 1 may be a double-layer polyimide (PI) substrate;

a first electrode layer 21, where the first electrode layer 21 is located on a side of the base substrate 1;

a light-emitting layer 4, where the light-emitting layer 4 is located on a side of the first electrode layer 21 facing away from the base substrate 1, the light-emitting layer 4 includes a plurality of light-emitting portions 40 emitting light of different colors; and the light-emitting portions 40 may include a first light-emitting portion 401 emitting red light, a second light-emitting portion 402 emitting green light, and a third light-emitting portion 403 emitting blue light;

a second electrode layer 22, where the second electrode layer 22 is located on a side of the light-emitting layer 4 facing away from the first electrode layer 21;

a black matrix layer 6, where the black matrix layer 6 is located on a side of the second electrode layer 22 facing away from the light-emitting layer 4, and the black matrix layer 6 includes a plurality of light outlets 60 corresponding to the plurality of light-emitting portions 40 in a one-to-one correspondence; and a shielding layer 7, where the shielding layer 7 is located on a side of the black matrix layer 6 facing away from the second electrode layer 22, and is provided with a plurality of shielding portions 70 covering the plurality of light outlets 60, transmittance of the shielding portion 70 is greater than transmittance of the black matrix layer 6, and light passing through the light outlets 60 is partially blocked and partially transmitted by the shielding portion 70. In some embodiments, the plurality of shielding portions 70 have the same transmittance.

In the embodiment of the present disclosure, the display panel further includes a black matrix layer 6 and a shielding layer 7 that are located on a side of the second electrode layer 22 facing away from the light-emitting layer 4, the shielding layer 7 is provided with a plurality of shielding portions 70 covering the plurality of light outlets 60, transmittance of the shielding portion 70 is greater than transmittance of the black matrix layer 6, and light passing through the light outlets 60 is partially blocked and partially transmitted by the shielding portions. When ambient light enters the display panel, the light passing through the black matrix layer 6 is completely blocked, and may not enter and be transmitted to the first electrode layer 21, intensity of light passing through the partially transparent and partially opaque shielding portions 70 decreases (for example, decreases to 40% to 60%), and after the light is reflected by the first electrode layer 21 to the shielding portions 70 again, the intensity of the light decreases again (for example, decreases to 20% to 30%). Therefore, the intensity of the light reflected into human eyes can be greatly reduced, such that reflectivity is reduced, and color separation can be avoided. Compared with an ordinary color film of which a semitransparent black matrix is made of red, green and blue resin, the number of times of exposure can be reduced, and difficulty in a display panel process is greatly reduced.

In a possible implementation mode, the first electrode layer 21 may be a reflective electrode layer, the second electrode layer 22 may be a transparent electrode layer, and the display panel may be a top-emission display panel. In some embodiments, the first electrode layer 21 may be an anode layer, and the second electrode layer 22 may be a cathode layer.

In a possible implementation mode, the transmittance of the shielding portion 70 is 60 times to 80 times the transmittance of the black matrix layer 6. In an embodiment of the present disclosure, the transmittance of the shielding portion 70 is 60 times to 80 times of the transmittance of the black matrix layer 6, such that the shielding portion 70 can have a blocking effect, and the influence on a display effect can be avoided.

The transmittance of the shielding portion 70 is 40% to 60%. The transmittance of the black matrix layer 6 is less than 1%.

In a possible implementation mode, the shielding layer 7 and the black matrix layer 6 contain the same composition in different proportions. In the embodiments of the present disclosure, the shielding layer 7 and the black matrix layer 6 contain the same composition in different proportions, which can simplify difficulty in a manufacturing process for the shielding layer 7.

During specific implementation, the shielding layer 7 and the black matrix layer 6 may reflect light via flaky or particulate pigments.

In a possible implementation mode, the shielding layer 7 and the black matrix layer 6 both contain particulate light-blocking pigments, and a mass ratio of the particulate light-blocking pigment in the shielding layer 7 is half a mass ratio of the particulate light-blocking pigment in the black matrix layer 6. In some embodiments, the material of the particulate light-blocking pigment includes one or a combination of: carbon, titanium, and nickel.

In a possible implementation mode, the shielding layer 7 and the black matrix layer 6 both contain flaky light-blocking pigments, and a mass ratio of the flaky light-blocking pigment in the shielding layer 7 is half a mass ratio of the flaky light-blocking pigment 6 in the black matrix layer. In some embodiments, the material of the flaky light-blocking pigment includes one or a combination of: titanium dioxide, titanium; and nickel.

In a possible implementation mode, the material of the shielding layer 7 and the material of the black matrix layer 6 both includes: a first dispersant, a solvent, and a resin; a mass ratio of the first dispersant in the shielding layer is the same as a mass ratio of the first dispersant in the black matrix layer; a mass ratio of the solvent in the shielding layer is greater than a mass ratio of the solvent in the black matrix layer; and a mass ratio of the resin in the shielding layer is larger than a mass ratio of the resin in the black matrix layer. In the embodiments of the present disclosure, the shielding layer 7 and the black matrix layer 6 are each made of a pigment including a first dispersant, a solvent, a resin and a flaky or particulate pigment for reflecting light. A pigment liquid has a strong ability to isolate light, can completely reflect light, and has high optical density (OD). The resin is low in cost and high in resistance.

In a possible implementation mode, the pigment liquid of the black matrix layer 6 contains: 15 to 35 phr of pigments, 1 to 5 phr of resins, 1 to 3 phr of first dispersants and 60 to 85 parts phr of solvents. The pigment liquid of the partially transparent and partially opaque shielding portion 70 contains: 7.5 to 17.5 phr of pigments, 2 to 7 parts phr of resins, 1 to 3 phr of first dispersants and 70 to 85 phr of solvents.

In some embodiments, the solvent may be made of propylene glycol methyl ether acetate.

In a possible implementation mode, as shown in FIG. 2, an orthographic projection of the shielding portion 70 on the base substrate 1 overlaps an orthographic projection of the light-emitting portion 40 on the base substrate 1. In the embodiments of the present disclosure, an orthographic projection of the shielding portion 70 on the base substrate 1 overlaps an orthographic projection of the light-emitting portion 40 on the base substrate 1, such that the situations that color separation cannot be well avoided if a coverage area of the shielding portion 70 is small, and light-emitting efficiency of the display panel is affected if the coverage area of the shielding portion 70 is too great can be avoided.

In a possible implementation mode, as shown in FIG. 2, a pixel defining layer 3 is further arranged between the light-emitting layer 4 and the first electrode layer 21, the pixel defining layer 3 is provided with a plurality of pixel openings 30, and the light-emitting portions 40 are located in the pixel openings 30. The pixel defining layer 3 is made of the same material as the black matrix layer 6. In an embodiment of the present disclosure, the pixel defining layer 3 is made of the same material as the black matrix layer 6, such that a manufacturing process for the display panel can be simplified.

Figure 3:
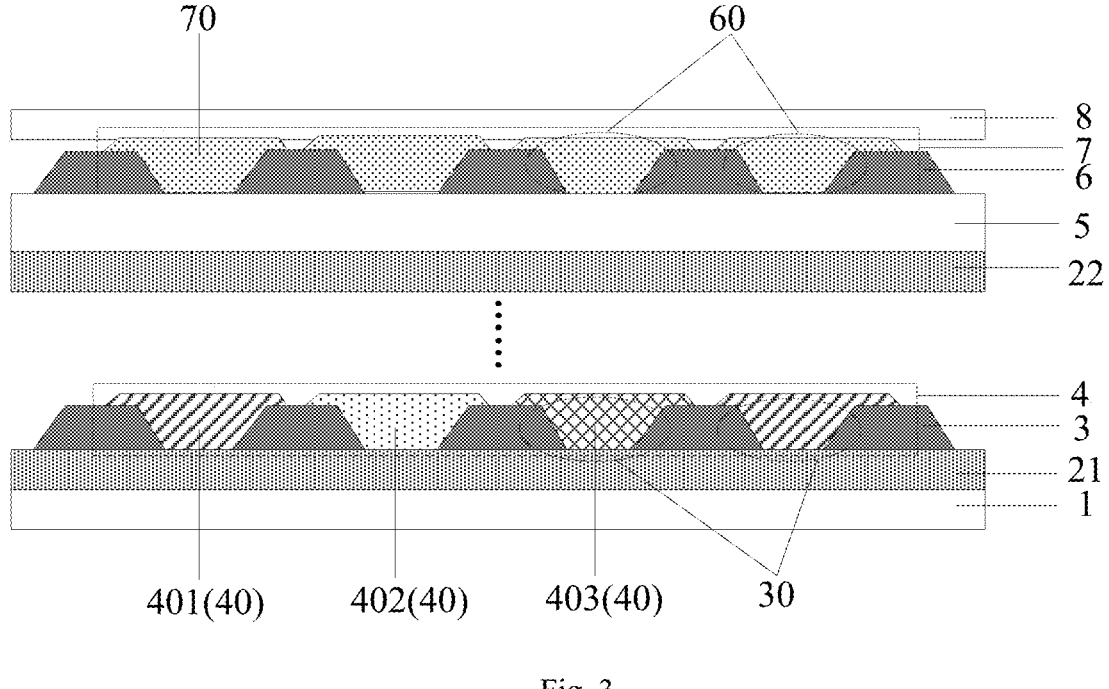
FIG. 3 is a schematic structural diagram of another display panel according to an embodiment of the present disclosure.

During specific implementation, as shown in FIG. 3, an encapsulation layer 5 is further arranged between the second electrode layer 22 and the black matrix layer 6. In some embodiments, an organic protective layer (OC) is further arranged on a side of the shielding layer 7 facing away from the black matrix layer 6. During specific implementation, other film layers may be arranged between the light-emitting layer 4 and the second electrode layer 22. For example, under the condition that the second electrode layer 22 is a cathode layer, an electron injection layer or an electron transport layer, etc. may be arranged between the light-emitting layer 4 and the second electrode layer 22. Other film layers, for example, a film layer constituting a thin film transistor for driving the light-emitting portion 40 to emit light, or a planarization layer, may be arranged between the base substrate 1 and the first electrode layer 21. In some embodiments, the first electrode layer 21 may include a plurality of first electrode blocks, and each electrode block corresponds to one light-emitting portion 40.

On the basis of the same disclosure concept, the embodiments of the present disclosure further provide a display apparatus. The display apparatus includes the display panel provided in the embodiments of the present disclosure.

On the basis of the same disclosure concept, the embodiments of the present disclosure further provide a manufacturing method for manufacturing the display panel provided in the embodiments of the present disclosure. As shown in FIG. 4, the manufacturing method includes following steps.

S100: providing a base substrate.

S200: forming a first electrode layer on a side of the base substrate.

S300: forming a light-emitting layer provided with a plurality of light-emitting portions on a side of the first electrode layer facing away from the base substrate.

S400: forming a second electrode layer on a side of the light-emitting layer facing away from the first electrode layer.

S500: forming a black matrix layer provided with a plurality of light outlets on a side of the second electrode layer facing away from the light-emitting layer.

S600: form a plurality of shielding portions covering the plurality of light outlets on a side of the black matrix layer facing away from the second electrode layer through a single mask patterning process.

As shown in FIG. 5, the S600 of forming a plurality of shielding portions covering the light outlets on a side of the black matrix layer facing away from the second electrode layer through a single mask patterning process may include following steps.

S610: forming a pigment liquid containing a first dispersant, a solvent, a resin and a pigment; in some embodiments, form the pigment liquid by mixing 7.5 to 17.5 phr of pigments, 2 to 7 phr of resins, 1 to 3 phr of first dispersants, and 70 to 85 phr of solvents.

S620: forming a mixed liquid by uniformly mixing the pigment liquid with a soluble resin, an initiator, a flatting agent and a monomer; in some embodiments, the monomer may be acrylic ester.

S630: forming the shielding portions by sequentially carrying out coating, exposure and development processes on the mixed liquid.

Beneficial effects of the embodiments of the present disclosure are as follows: in the embodiments of the present disclosure, the display panel further includes a black matrix layer and a shielding layer that are located on a side of the second electrode layer facing away from the light-emitting layer, the shielding layer is provided with a plurality of shielding portions covering the light outlets, transmittance of the shielding portion is greater than transmittance of the black matrix layer, and light passing through the light outlets is partially blocked and partially transmitted by the shielding portion. When ambient light enters the display panel, the light passing through the black matrix layer is completely blocked, and may not enter and be transmitted to the first electrode layer, the intensity of light passing through the partially transparent and partially opaque shielding portions decreases (for example, decreases to 40% to 60%), and after the light is reflected by the first electrode layer to the shielding portions again, the intensity of the light decreases again (for example, decreases to 20% to 30%). Therefore, the intensity of the light reflected into human eyes can be greatly reduced, such that reflectivity is reduced, and color separation can be avoided. Compared with an ordinary color film of which a semitransparent black matrix is made of red, green and blue resins, the number of times of exposure can be reduced, and difficulty in a display panel process is greatly reduced.

Apparently, those skilled in the art can make various modifications and variations to the present disclosure without departing from the spirit and scope of the present disclosure. In this way, in the case that these modifications and variations of the present disclosure fall within the scope of the claims of the present disclosure and their equivalent technologies, the present disclosure is further intended to include these modifications and variations.

What is claimed is:

1. A display panel, comprising:
a base substrate;
a first electrode layer, located on a side of the base substrate;
a light-emitting layer, located on a side of the first electrode layer facing away from the base substrate, wherein the light-emitting layer comprises a plurality of light-emitting portions emitting light of different colors;
a second electrode layer, located on a side of the light-emitting layer facing away from the first electrode layer;
a black matrix layer, located on a side of the second electrode layer facing away from the light-emitting layer; wherein the black matrix layer comprises a plurality of light outlets corresponding to the plurality of light-emitting portions in a one-to-one correspondence; and
a shielding layer, located on a side of the black matrix layer facing away from the second electrode layer, and provided with a plurality of shielding portions covering the plurality of light outlets; wherein transmittance of the shielding portion is greater than transmittance of the black matrix layer, and light passing through the plurality of light outlets is partially blocked and partially transmitted by the shielding portion;
wherein the shielding layer and the black matrix layer contain same composition in different proportions.

2. The display panel according to claim 1, wherein the transmittance of the shielding portion is 60 times to 80 times the transmittance of the black matrix layer.

3. The display panel according to claim 1, wherein the transmittance of the shielding portion is 40% to 60%.

4. The display panel according to claim 1, wherein the shielding layer and the black matrix layer both contain particulate light-blocking pigments, and a mass ratio of the particulate light-blocking pigment in the shielding layer is half a mass ratio of the particulate light-blocking pigment in the black matrix layer.

5. The display panel according to claim 4, wherein a material of the particulate light-blocking pigment comprises one or a combination of:
carbon;
titanium; and
nickel.

6. The display panel according to claim 4, wherein materials forming the shielding layer and the black matrix layer both comprise: a first dispersant, a solvent and a resin;
a mass ratio of the first dispersant in the shielding layer is the same as a mass ratio of the first dispersant in the black matrix layer;
a mass ratio of the solvent in the shielding layer is greater than a mass ratio of the solvent in the black matrix layer; and
a mass ratio of the resin in the shielding layer is greater than a mass ratio of the resin in the black matrix layer.

7. The display panel according to claim 1, wherein the shielding layer and the black matrix layer both contain flaky light-blocking pigments, and a mass ratio of the flaky light-blocking pigment in the shielding layer is half a mass ratio of the flaky light-blocking pigment in the black matrix layer.

8. The display panel according to claim 7, wherein a material of the pigment comprises one or a combination of:

titanium dioxide;

titanium; and nickel.

9. The display panel according to claim 7, wherein materials forming the shielding layer and the black matrix layer both comprise: a first dispersant, a solvent and a resin;

a mass ratio of the first dispersant in the shielding layer is the same as a mass ratio of the first dispersant in the black matrix layer;

a mass ratio of the solvent in the shielding layer is greater than a mass ratio of the solvent in the black matrix layer; and a mass ratio of the resin in the shielding layer is greater than a mass ratio of the resin in the black matrix layer.

10. The display panel according to claim 1, wherein an orthographic projection of the shielding portion on the base substrate overlaps an orthographic projection of the light-emitting portion on the base substrate.

11. The display panel according to claim 1, wherein a pixel defining layer is further arranged between the light-emitting layer and the first electrode layer; wherein the pixel defining layer is provided with a plurality of pixel openings, and the plurality of light-emitting portions each is located in a respective one of the plurality of pixel openings; and the pixel defining layer is made of a same material as the black matrix layer.

12. A display apparatus, comprising the display panel according to claim 1.

13. A manufacturing method for manufacturing the display panel according to claim 1, comprising:

providing the base substrate;

forming the first electrode layer on the side of the base substrate;

forming the light-emitting layer provided with the plurality of light-emitting portions on the side of the first electrode layer facing away from the base substrate;

forming the second electrode layer on the side of the light-emitting layer facing away from the first electrode layer;

forming the black matrix layer provided with the plurality of light outlets on the side of the second electrode layer facing away from the light-emitting layer; and forming the plurality of shielding portions covering the plurality of light outlets on the side of the black matrix layer facing away from the second electrode layer through a single mask patterning process.

14. The manufacturing method according to claim 13, wherein the forming a plurality of shielding portions covering the plurality of light outlets on a side of the black matrix layer facing away from the second electrode layer through a single mask patterning process comprises:

forming a pigment liquid containing a first dispersant, a solvent, a resin and a pigment;

forming a mixed liquid by uniformly mixing the pigment liquid with a soluble resin, an initiator, a flatting agent and a monomer; and forming the shielding portions by sequentially carrying out coating, exposure and development processes on the mixed liquid.

15. The manufacturing method according to claim 14, wherein the forming a pigment liquid containing a first dispersant, a solvent, a resin and a pigment comprises:

forming the pigment liquid by mixing 7.5 to 17.5 phr of pigments, 2 to 7 phr of resins, 1 to 3 phr of first dispersants, and 70 to 85 phr of solvents.

* * * * *